(12) United States Patent
Taniyama et al.

(10) Patent No.: US 6,495,473 B2
(45) Date of Patent: Dec. 17, 2002

(54) SUBSTRATE PROCESSING APPARATUS AND METHOD OF MANUFACTURING SEMICONDUCTOR DEVICE

(75) Inventors: Tomoshi Taniyama, Tokyo (JP); Kouji Tometsuka, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/098,472

(22) Filed: Mar. 18, 2002

(65) Prior Publication Data

US 2002/0168877 A1 Nov. 14, 2002

(30) Foreign Application Priority Data

May 14, 2001 (JP) ......................................... 2001-143880

(51) Int. Cl.[7] .......................... H01L 21/31; H01L 21/44; C23C 16/00
(52) U.S. Cl. ...................... 438/758; 438/680; 438/681; 422/585; 118/715; 118/724; 118/725
(58) Field of Search ................................. 438/758, 680, 438/681; 427/585; 118/715, 724, 725

(56) References Cited

U.S. PATENT DOCUMENTS

| | | | | |
|---|---|---|---|---|
| 4,732,110 A | * | 3/1988 | Parsons | 118/719 |
| 5,888,303 A | * | 3/1999 | Dixon | 118/715 |
| 5,985,033 A | * | 11/1999 | Yudovsky et al. | 118/715 |
| 6,093,252 A | * | 7/2000 | Wengert etal. | 118/719 |
| 6,110,556 A | * | 8/2000 | Bang et al. | 428/64.1 |

FOREIGN PATENT DOCUMENTS

| | | |
|---|---|---|
| JP | 05-112870 A | 5/1993 |
| JP | 5-30357 | 8/1993 |
| JP | 06-275533 A | 9/1994 |

* cited by examiner

*Primary Examiner*—Alexander Ghyka
(74) *Attorney, Agent, or Firm*—McGinn & Gibb, PLLC

(57) ABSTRACT

A substrate processing apparatus, wherein a flowing direction of a gas flow which has flown upwardly and ascended in an inner tube (3A) is changed at an upper portion of the inner tube (3A) so as to be flown between the inner tube (3A) and an outer tube (2A) and exhausted outwardly, comprising: an inner tube cap 11 suited for covering the upper portion of the inner tube (3A); gas passages provided between the upper portion of the inner tube (3A) and the inner tube cap (11); and the inner tube cap (11) having a central portion protruded into an upstream of the gas flow. According to the substrate processing apparatus thus configured and a method of manufacturing a semiconductor device using the substrate processing apparatus, it is possible to prevent a reaction product from being deposited on a ceiling portion of an outer tube as well as being deposited as particles on a processing or processed substrate or substrates disposed in the inner tube. Further, it is possible to smoothly deflect the direction of a gas flow so as to allow the substrate to be uniformly processed with a high quality.

4 Claims, 6 Drawing Sheets

SUBSTRATE PROCESSING APPARATUS AND METHOD OF MANUFACTURING SEMICONDUCTOR DEVICE

TECHNICAL FIELD

The present invention relates generally to a substrate processing apparatus and a method of manufacturing a semiconductor device and, more particularly, to a substrate processing apparatus capable of preventing a reaction product from being deposited on a cell portion of an outer tube in a vertical type CVD apparatus and a method for manufacturing a semiconductor device using the substrate processing apparatus.

BACKGROUND OF THE INVENTION

FIG. 7 illustrates a longitudinally front sectional view of a vertical type CVD apparatus conventionally used as a substrate processing apparatus. In this substrate processing apparatus, there are provided within a heater 1 an outer tube 2 and an inner tube 3 which is disposed in the outer tube 2 and accommodates therein a boat 4 carrying a plurality of semiconductor substrates (semiconductor wafers), e.g., 5a, 5b for depositing or forming a film on each surface of the semiconductor substrates.

FIG. 8 is a schematic sectional view showing a bottom portion of a reaction chamber (as designated by "A" in FIG. 7) of the substrate processing apparatus. A gas supply to the substrates is performed by introducing a gas from a gas-introducing port 6 of an adapter 7 into the inner tube 3, so as to upwardly flow along the substrates and consecutively flow into a space between an outer-wall of the inner tube 3 and an inner-wall of the outer tube 2 and then discharged outwardly via an exhaust pipe 8.

FIG. 9 is a schematic sectional view showing an upper portion of the substrate processing apparatus in order to illustrate an inherent problem of this substrate processing apparatus. Although such a gas circulation through the apparatus caused by the gas supply is performed as mentioned above, a reaction product 9 will be deposited on a ceiling portion of the outer tube 2 during the above-noted film deposition on the substrates, as shown in FIG. 9, and disadvantageously adhered to the processed or processing substrates as particles when the reaction product 9 is peeled from the ceiling portion.

In order to solve this problem, there is proposed a vertical type CVD apparatus comprising an outer tube and inner tube in Japanese Patent Laid-Open Publication No. HEI 6-275533. In particular, the inner tube is configured to have a closed top end, an exhaust opening provided on a side wall thereof in vicinity of the closed top end and an introducing port for a reaction gas located on a lower end portion thereof. The exhaust opening is in communication with an interior of the outer tube, i.e., a space defined between the outer tube and inner tube.

According to this prior art, the closed top end of the inner tube is flat or in the form of an inverted cup. Thus, a gas flow which flows upwardly in the inner tube can not be smoothly deflected into the outer tube but rather tends to be held up or stayed at the closed top end within the outer tube, as a result of which it is difficult to uniformly process semiconductor substrates with a high quality or there is a fear not to manufacture semiconductor devices on the substrate.

Thus, the present invention is accomplished to solve the problems as mentioned above.

SUMMARY OF THE INVENTION

In order to solve the problems as noted above, according to a first aspect of the present invention, there is provided a substrate processing apparatus, wherein a flowing direction of a gas flow which has flown upwardly and ascended in an inner tube is changed at an upper portion of the inner tube so as to be flown between the inner tube and an outer tube and exhausted outwardly, comprising: a gas flow-deflecting member consisting a cap portion for covering an open top end in the upper portion of the inner tube and a support portion for supporting said cap portion, said support portion being mounted on a circumferential edge of the open top end of the inner tube, and said cap portion being in the form of an inverted cone having a central portion protruded into an upstream of the gas flow; and gas passages provided between the open top end of the inner tube and said cap portion.

In particular, the inverted cone, which shapes the cap portion, has a tip end positioned a downstream side of the gas flow than a bottom end of said support portion.

According to a second aspect of the present invention, there is provided a substrate processing apparatus, wherein a flowing direction of a gas flow which has flown upwardly and ascended in an inner tube is changed at an upper portion of the inner tube so as to be flown between the inner tube and an outer tube and exhausted outwardly, comprising: a gas flow-deflecting member for covering the upper portion of the inner tube; gas passages provided between the upper portion of the inner tube and the gas flow-deflecting member; said gas flow-deflecting member having a central portion protruded into an upstream of the gas flow; and a heater for heating substrates carried in the substrate processing apparatus, wherein a top end of said heater is extended up to a higher position than a top end of the outer tube.

According to a third aspect of the present invention, there is provided a method for manufacturing a semiconductor device comprising the steps of: carrying at least one substrate in an inner tube, heating the substrate, flowing a gas upwardly in said inner tube, changing direction of the gas flow by a gas flow-deflecting member, consisting a cap portion for covering an open end in the upper portion of the inner tube and a support portion for supporting said cap portion, said support portion being mounted on a circumferential edge of the open top end of the inner tube, and cap portion being in the form of an inverted cone, flowing the gas downwardly through the inner tube and an outer tube so as to exhaust outward of the outer tube.

With an arrangement as described above, the flowing direction of a gas which has flown upwardly within the inner tube and ascended to the upper portion of the inner tube is changed in a transverse direction by the gas flow-deflecting member which is disposed on the open top end of the inner tube to flow the gas through gaps defined between the top end of the inner tube and the gas flow-deflecting member and then into a space between the outer tube and the inner tube downwardly. Therefore, a ceiling portion of an outer tube is prevented from being directly exposed to a gas uprising in the inner tube, thereby preventing a reaction product from be deposited on the ceiling portion. Also, even if the reaction product is allowed to be deposited on the ceiling portion and then peeled off or dropped therefrom, the gas flow-deflecting member can receive their droppings as particles on its upper surface to prevent them from being adhered to or deposited on a wafer(s). Since the gas flow-deflecting member is in the form of an inverted cone having a protruded center directed downwardly to an upstream of the gas flow, the reaction gas is disenabled to hold up or stay thereat. Further, since the protruded center of the gas flow-deflecting member is positioned or configured to be approximate to a high-temperature side location within a furnace, the gas flow-deflecting member is able to avoid deposition of the reaction product on itself.

Thus, according to the present invention, it is possible to allow the substrate to be uniformly processed with a high quality and uniformly manufacture semiconductor devices on the substrate with a high quality. Also, the gas flow-deflecting member may directly be mounted on the circumferential edge of the open top end of the inner tube, be disposed on an upper end portion of a boat accommodated in the inner tube, or be suspended from the ceiling portion of the outer tube. Furthermore, in order to more efficiently introduce a gas flow into a space defined between the inner tube and the outer tube, the gas flow-deflecting member may include an eave along a periphery thereof.

In an embodiment of the present invention as described below, the gas flow-deflecting member as an inner-tube cap is made of the same material as that for the inner tube which is made of quartz. Therefore, the gas flow-deflecting member has the same thermal expansion as that of the inner tube, thereby effectively preventing a misalignment between the inner tube and the gas flow-deflecting member due to a difference of thermal expansion. Also, in the embodiment as described below, a heaters are extended up to and in a surrounding relation to an upper portion of a reaction tube to such an extent as sufficiently heating the gas flow-deflecting member, thereby effectively preventing a reaction product from being deposited on the gas flow-deflecting member.

BRIEF DESCRIPTION OF THE DRAWINGS

An embodiment of the present invention will now be described, by way of example, with reference to the accompanying drawings, in which.

DETAILED DESCRIPTION OF THE INVENTION

Figure 1:
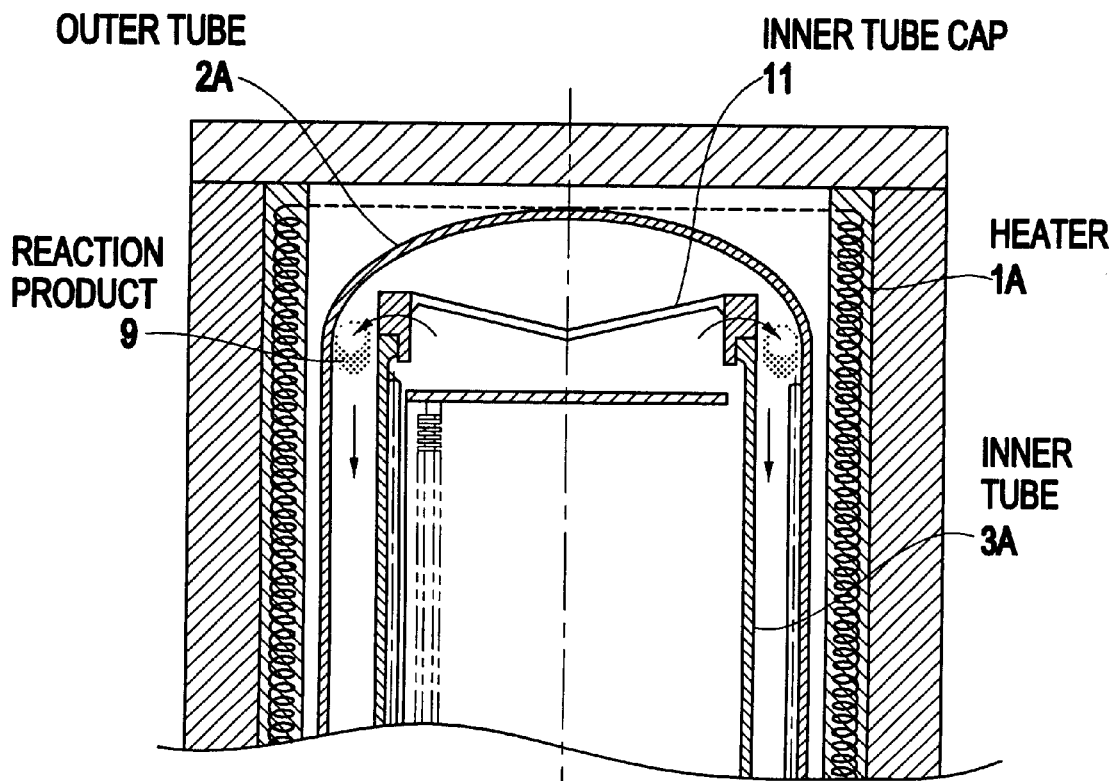
FIG. 1 is a front sectional view showing an upper portion of a substrate processing apparatus according to the embodiment of the present invention, especially depicting a top portion of an inner tube thereof.
Figure 2:
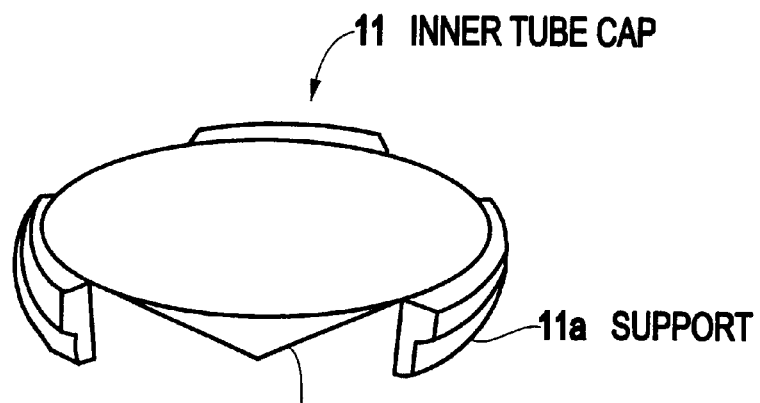
FIG. 2 is a perspective view showing a inner tube cap of the inner tube of FIG. 1.

In the following detailed description of the embodiment, corresponding reference characters indicate corresponding parts throughout the several views.

Figure 9:
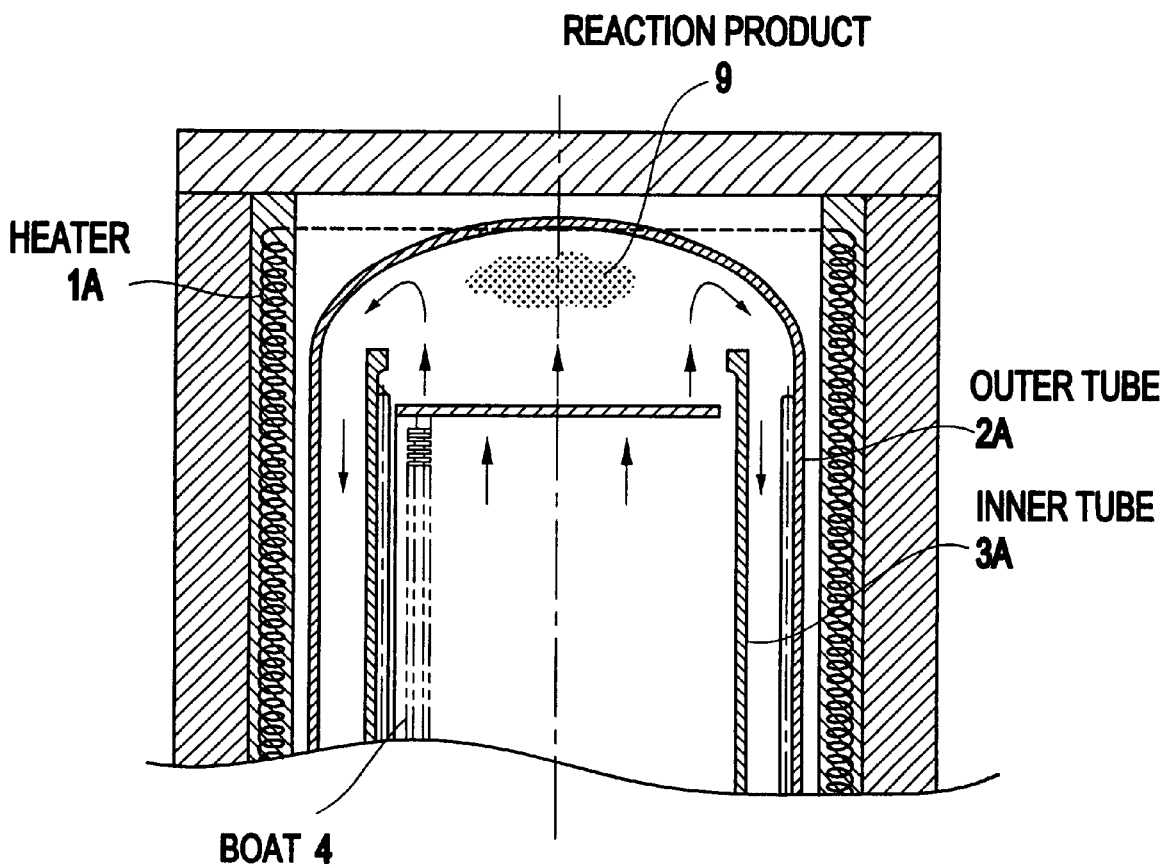
FIG. 9 is a schematic front sectional view showing an upper portion of the substrate processing apparatus of FIG. 7.

FIG. 1 is a schematic front sectional view showing an upper portion of a substrate processing apparatus according to the embodiment, especially depicting upper portions of an inner tube and outer tube of the substrate processing apparatus, and corresponds to that as shown in FIG. 9 of the conventional apparatus.

Figure 3:
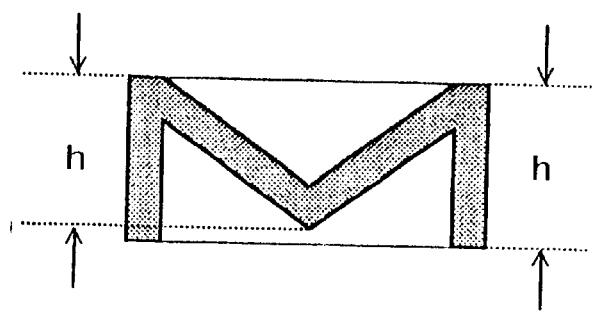
FIG. 3 is a schematic side sectional view showing the inner tube cap of the inner tube of FIG. 1.

As shown in FIG. 1, the inner tube 3A includes an inner tube cap 11 mounted on an upper portion thereof, more specifically an open top end thereof. This inner tube cap 11 includes supports 11a which are angularly spaced apart from each other so as to be disposed in several proper positions along a circumferential edge of the open top end of the inner tube 3A, and a cap portion 11b supported by the supports 11a and being in the form of an inverted cone which is mounted on the supports 11a so as to be dependent from the supports. As shown in FIG. 3, the support 11a has a height h' which is defined to exist a clearance between a top end of the inner tube 3A and the outer tube 2A. Also, a protrusion amount h of a central portion of the cap portion 11b is made slightly smaller than the height h' of the support (h<h'), thereby allowing the inner tube cap 11 to be easily laid steady on a worktable and the like in the case of handling it singularly.

In the arrangement as configured above, a reaction gas does not flow along the ceiling portion of the outer tube 2A but flows along an inner wall of the outer tube 2A. Therefore, it advantageously becomes difficult to deposit a reaction product on the ceiling portion of the outer tube 2A. Even if the reaction product is deposited on the ceiling portion and then peeled off therefrom, the inner tube cap 11 can receive their droppings as particles on its upper surface to prevent them from being adhered to or deposited on a wafer(s). Since the inner tube cap 11 is in the form of an inverted cone having a protruded center directed downwardly to an upstream of the gas flow, the reaction gas is enabled to easily flow downwardly along the inner wall of the outer tube 12. Further, since the protruded center of the cap portion 11b is positioned or configured to be approximate to a high-temperature side location within a furnace, the inner tube cap 11 serving as a gas flow-deflecting member is able to avoid deposition of the reaction product on itself. Furthermore, in this embodiment, a heater 1A as shown FIG. 1 is extended up to a top end of the outer tube for effectively heating the inner tube cap 11.

For example, in the case of TEOS process, a temperature of the inner tube cap having the height h' becomes higher than that of the ceiling portion of the outer tube 2A. In addition, since the inner tube cap is protruded at its central portion by the protrusion amount h, it is possible to further increase a tip end temperature thereof, thereby advantageously becoming difficult to deposit the reaction product on the cap.

Referring again to FIG. 1, the inner tube cap 11 is mounted on the upper end of the inner tube, but these may be one-piece member. Also, the protrusion end of the cap 11b is in the form of an inverted cone, but it may assume to be rounded.

Figure 4:
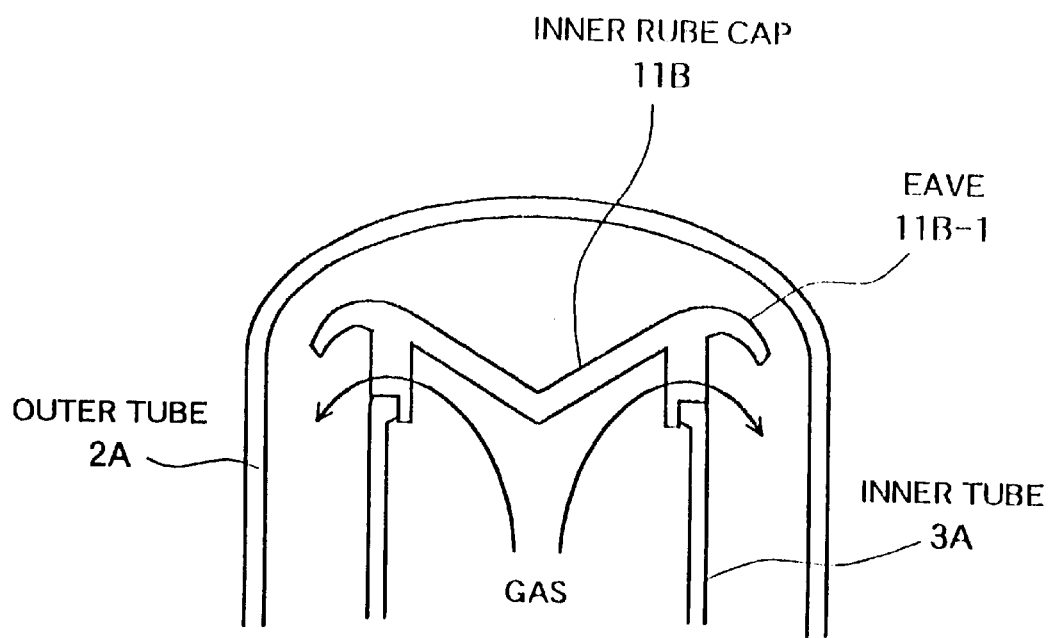
FIG. 4 is a schematic side sectional view showing upper portions of inner-and outer tubes according to a second embodiment of the present invention.

Referring now to FIG. 4, there is shown a second embodiment of the present invention, wherein an inner tube cap 11B includes an eave 11B-1 along a periphery of the cap. It is possible to more efficiently introduce a gas flow along the eave.

Figure 5:
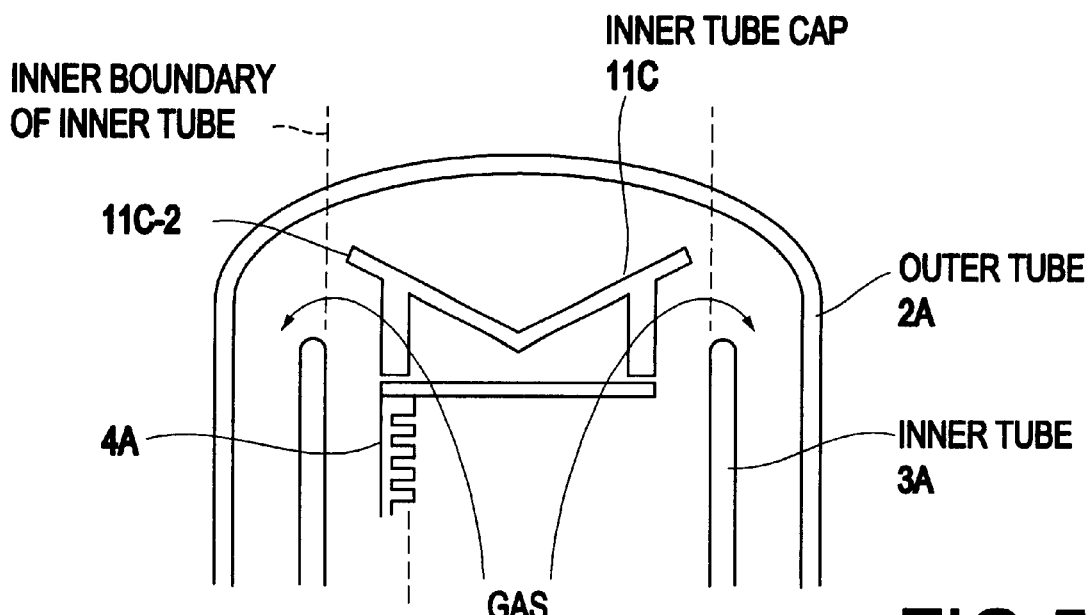
FIG. 5 is a schematic side sectional view showing an upper portions of inner-and outer tubes according to a third embodiment of the present invention.

FIG. 5 is an arrangement according to a third embodiment of the present invention and similar to that as shown in FIG. 3. In this arrangement, an inner tube cap 11C is disposed on an upper end portion of a boat 4A, and especially a periphery 11C-2 of that cap cannot overreach (an inner boundary of)

the inner tube but a gas stream can be produced. Due to this stream, a ceiling portion of an outer tube is prevented from being directly exposed to a gas uprising in the inner tube. This arrangement can produce various advantageous effects.

Figure 6:
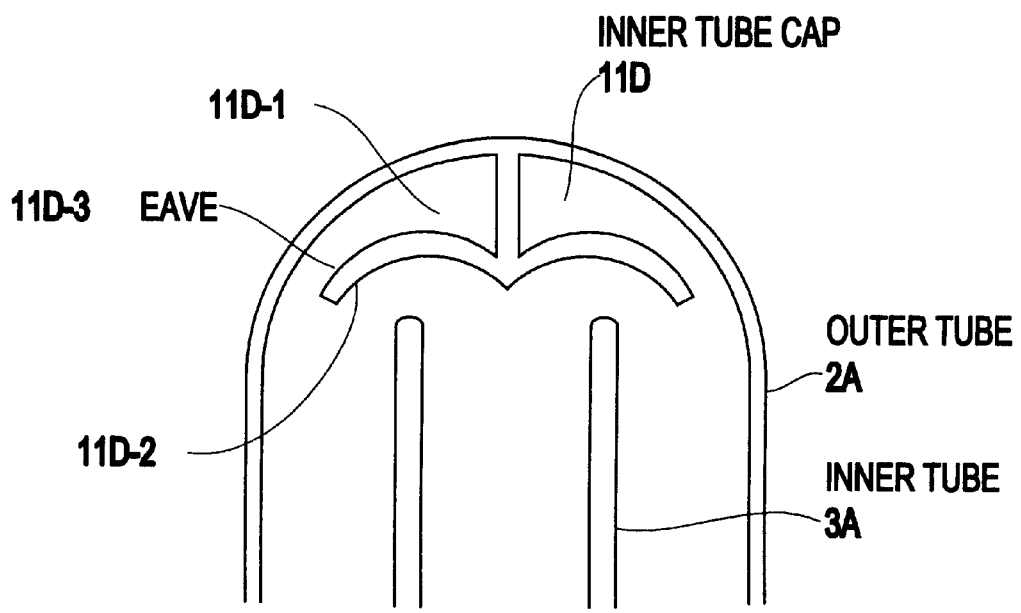
FIG. 6 is a schematic side sectional view showing an upper portions of inner-and outer tubes according to a fourth embodiment of the present invention.
Figure 7:
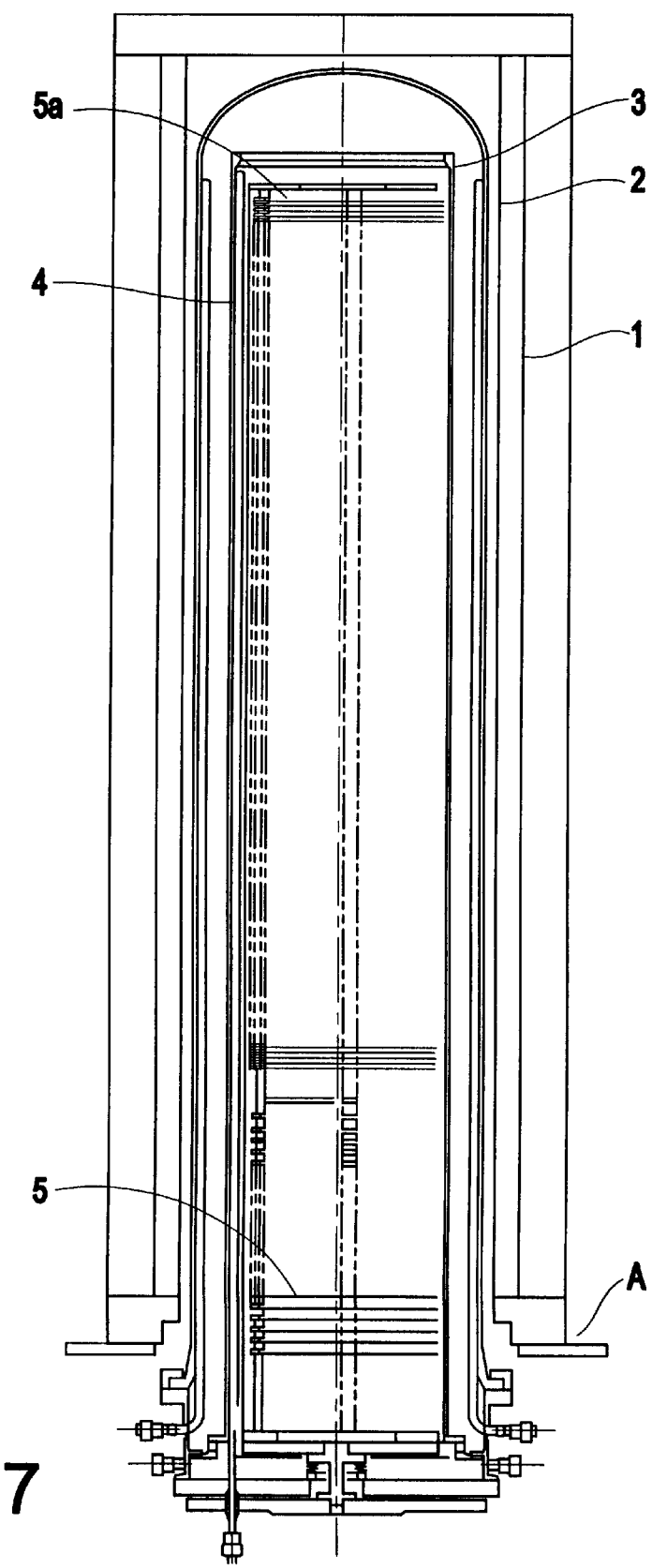
FIG. 7 is a schematic front sectional view showing a vertical type CVD apparatus as a conventional substrate processing apparatus.
Figure 8:
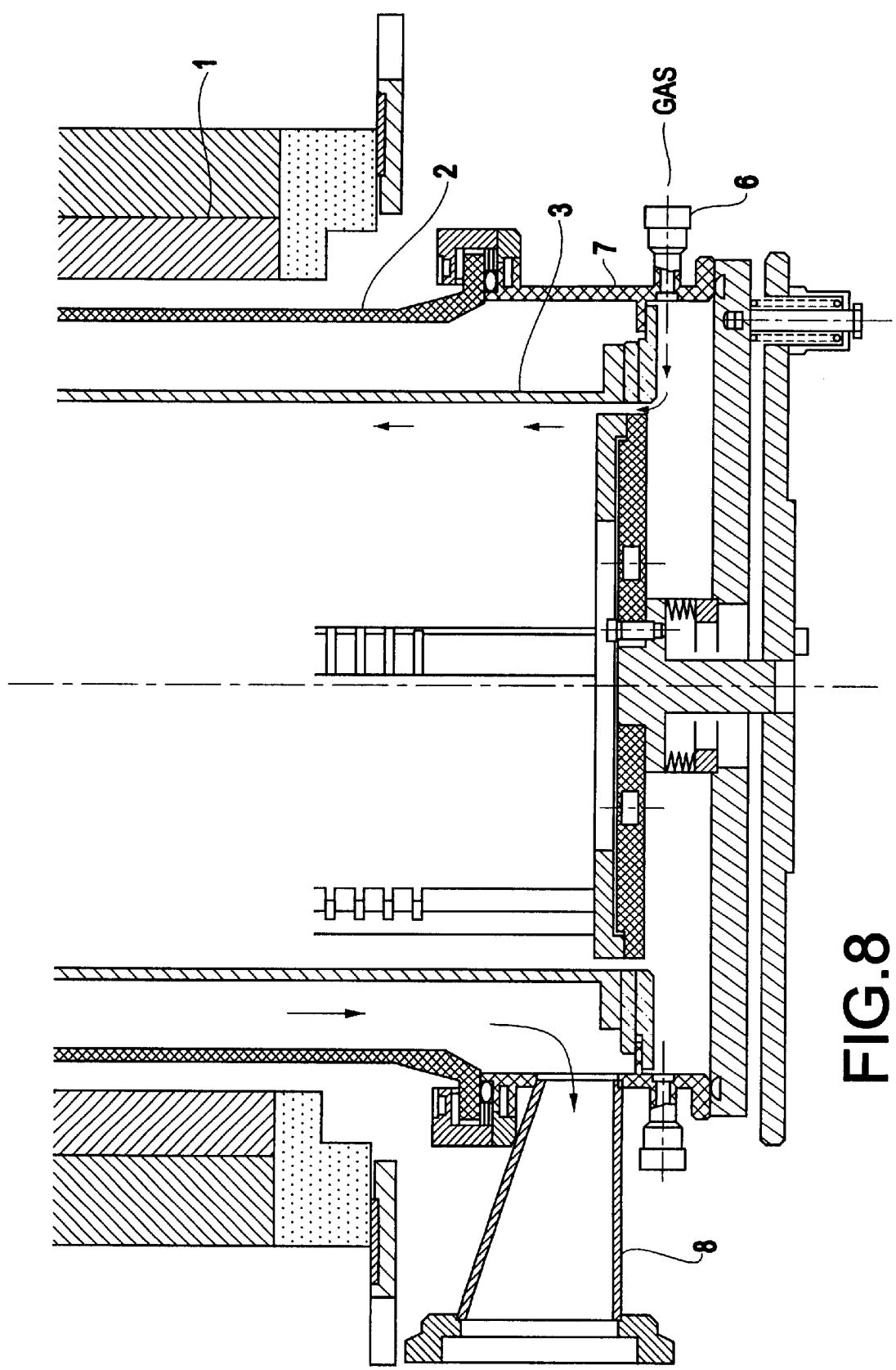
FIG. 8 is a schematic sectional view showing a bottom portion of a reaction chamber (as designated by "A" in FIG. 7) of the conventional substrate processing apparatus.

FIG. 6 is an arrangement according to fourth embodiment of the present invention, wherein an inner tube cap 11D is configured to be suspended from a ceiling portion of an outer tube. In this case, the inner tube cap 11D comprises a support 11D-1 supported by the outer tube and a cap portion 11D-2 mounted on a tip end (lower end) of the support 11D-1. In particular, there is provided an eave 11D-3 along a periphery of this cap 11D-2.

As is clear from the above description, in one form, the present invention is a substrate processing apparatus, wherein a flowing direction of a gas flow which has flown upwardly and ascended in an inner tube 3A is changed at an upper portion of the inner tube so as to be flown between the inner tube 3A and an outer tube 2A and exhausted outwardly, comprising: a gas flow-deflecting member (11) for covering the upper portion of the inner tube; gas passages provided between the upper portion of the inner tube and the gas flow-deflecting member; and said gas flow-deflecting member 11 having a central portion protruded into an upstream of the gas flow.

In another form, the present invention is a method of manufacturing a semiconductor device by flowing upwardly within an inner tube carrying a plurality of substrates therein a gas suited for use in processing a substrate, then changing the gas flow at a top end of the inner tube 3A so as to flow downwardly between the inner tube 3A and an outer tube 2A, comprising the steps of: providing a gas flow-deflecting member (11) to cover an open top end of the inner tube and protruding a central portion of said gas flow-deflecting member into an upstream of the gas flow; and flowing the gas which has ascended to an upper portion of the inner tube through at least one gap between the top end of the inner tube and said gas flow-deflecting member so as to manufacture at least one semiconductor device on the substrate.

In still another form, the present invention is a substrate processing apparatus having an outer tube and an inner tube 2A disposed in the outer tube and accommodating therein a boat carrying a plurality of semiconductor substrates to be processed by a reaction gas, wherein a flowing direction of a gas flow which has flown upwardly and ascended so as to flow along the substrates within the inner tube is changed at an upper portion of the inner tube so as to be flown into a space defined between the inner tube 3A and the outer tube 2A and exhausted outwardly via an exhaust opening on the outer tube, comprising:

gas flow-deflecting means (11) for covering an open top end of the upper portion of the inner tube and defined gas passages in a fluid communication with the space between the inner and outer tubes 3A, 2A; and said gas flow-deflecting means (11) having a central portion protruded into an upstream of the gas flow so as to slant upwardly from the central portion to a periphery of said gas flow-deflecting means for guiding the gas flow via the gas passages into the space between the inner and outer tubes.

As described above, in accordance with the present invention, it is possible to prevent a reaction product from being deposited on a ceiling portion of an outer tube as well as being deposited as particles on a substrate. Further, it is possible to smoothly deflect the direction of a gas flow so as to allow the substrate to be uniformly processed with a high quality. Thus, the present invention is highly effective in manufacturing a semiconductor device.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

What is claimed is:

1. A substrate processing apparatus, wherein a flowing direction of a gas flow which has flown upwardly and ascended in an inner tube is changed at an upper portion of the inner tube so as to be flown between the inner tube and an outer tube and exhausted outwardly, said substrate processing apparatus comprising:

a gas flow-deflecting member consisting a cap portion for covering an open top end in the upper portion of the inner tube and a support portion for supporting said cap portion, said support portion being mounted on a circumferential edge of the open top end of the inner tube, and said cap portion being in the form of an inverted cone having a central portion protruded into an upstream of the gas flow; and gas passages provided between the open top end of the inner tube and said cap portion.

2. The substrate processing apparatus as claimed in claim 1, wherein the inverted cone which shapes said cap portion has a tip end positioned a downstream side of the gas flow than a bottom end of said support portion.

3. A substrate processing apparatus, wherein a flowing direction of a gas flow which has flown upwardly and ascended in an inner tube is changed at an upper portion of the inner tube so as to be flown between the inner tube and an outer tube and exhausted outwardly, said substrate processing apparatus comprising:

a gas flow-deflecting member for covering the upper portion of the inner tube;

gas passages provided between the upper portion of the inner tube and the gas flow-deflecting member;

said gas flow-deflecting member having a central portion protruded into an upstream of the gas flow; and a heater for heating substrates carried in the substrate processing apparatus, wherein a top end of said heater is extended up to a higher position than a top end of the outer tube.

4. A method for manufacturing a semiconductor device comprising the steps of:

carrying at least one substrate in an inner tube, heating the substrate, flowing a gas upwardly in said inner tube, changing direction of the gas flow by a gas flow-deflecting member, consisting a cap portion for covering an open end in the upper portion of the inner tube and a support portion for supporting said cap portion, said support portion being mounted on a circumferential edge of the open top end of the inner tube, and cap portion being in the form of an inverted cone, flowing the gas downwardly through the inner tube and an outer tube so as to exhaust outward of the outer tube.

* * * * *